United States Patent
Honma

(10) Patent No.: US 9,598,767 B2
(45) Date of Patent: Mar. 21, 2017

(54) GAS PROCESSING APPARATUS

(71) Applicant: Tokyo Electron Limited, Tokyo (JP)

(72) Inventor: Manabu Honma, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 527 days.

(21) Appl. No.: 14/302,523

(22) Filed: Jun. 12, 2014

(65) Prior Publication Data
US 2014/0366808 A1 Dec. 18, 2014

(30) Foreign Application Priority Data
Jun. 14, 2013 (JP) .................. 2013-125668

(51) Int. Cl.
C23C 16/44 (2006.01)
H01J 37/32 (2006.01)

(52) U.S. Cl.
CPC ..... *C23C 16/4409* (2013.01); *H01J 37/32513* (2013.01)

(58) Field of Classification Search
CPC ............ C23C 16/4409; H01J 37/32513
USPC ........................................ 118/733
See application file for complete search history.

(56) References Cited

U.S. PATENT DOCUMENTS

| | | | | |
|---|---|---|---|---|
| 929,017 A | * | 7/1909 | Reynard | C23C 14/505 118/730 |
| 5,241,819 A | * | 9/1993 | Ta | B61G 7/12 213/75 R |
| 6,958,097 B2 | * | 10/2005 | Luttringhaus-Henkel | B65B 7/2835 118/500 |
| 2009/0146380 A1 | * | 6/2009 | Votaw | B01F 5/0471 277/314 |
| 2010/0055312 A1 | * | 3/2010 | Kato | C23C 16/45502 427/255.26 |
| 2010/0151131 A1 | * | 6/2010 | Obara | C23C 16/4412 427/255.28 |
| 2011/0126985 A1 | * | 6/2011 | Ohizumi | C23C 16/45546 156/345.55 |
| 2014/0366808 A1 | * | 12/2014 | Honma | C23C 16/4409 118/733 |
| 2015/0267296 A1 | * | 9/2015 | Nishida | H01L 21/0214 438/787 |
| 2016/0319422 A1 | * | 11/2016 | Kurita | H01L 21/67748 |

FOREIGN PATENT DOCUMENTS

| | | | |
|---|---|---|---|
| JP | 59104118 A | * | 6/1984 |
| JP | 2010-135510 | | 6/2010 |

* cited by examiner

*Primary Examiner* — Jeffrie R Lund
(74) *Attorney, Agent, or Firm* — IPUSA, PLLC

(57) ABSTRACT

A gas processing apparatus includes a process chamber for installing a process target therein, a through-hole being air-tightly in communication with a gas supply pipe, an injector for supplying gas into the process chamber, a sleeve being engaged to an outer peripheral surface of the injector inside the through-hole, an annular sealing member engaged to the outer peripheral surface of the injector, an engagement surface facing the sealing member, and a pressing part for pressing the sleeve toward the outer side of the process chamber. The pressing part compresses the sealing member by exerting pressure to the engagement surface from an end surface of the sleeve toward the sealing member, so that an inside of the injector and an outside of the injector are air-tightly sealed.

8 Claims, 15 Drawing Sheets

GAS PROCESSING APPARATUS

CROSS-REFERENCE TO RELATED APPLICATIONS

The present application is based upon and claims the benefit of priority of Japanese Patent Application No. 2013-125668 filed with the Japanese Patent Office on Jun. 14, 2013, the entire contents of which are incorporated herein by reference.

BACKGROUND OF THE INVENTION

1. Field of the Invention

The present invention generally relates to a gas processing apparatus that performs processing on a process target by supplying gas in a chamber from an injector that is air-tightly inserted into the chamber.

2. Description of the Related Art

As one method for depositing a thin film (e.g., silicon oxide film ($SiO_2$)) on a substrate such as a semiconductor wafer, there is an Atomic Layer Deposition (ALD) method. For example, patent document 1 (Japanese Laid-Open Patent Publication No. 2010-135510) discloses a film deposition apparatus that uses the ALD method. The known apparatus has 5 wafers arranged on a rotation table inside a vacuum chamber (process chamber) in a circumferential direction of the rotation table and has multiple gas injectors arranged in a manner facing the rotation table. Further, in a case of attaching each of the gas injectors to the vacuum chamber in this apparatus, metal gas pipes such as so-called flexible pipes being formed into bellow-like shapes are arranged at an outer side of the vacuum chamber.

More specifically, a through hole having a diameter larger than an outer diameter of the gas injector is formed at a sidewall surface of the vacuum chamber. The gas injector is inserted into the through hole from, for example, an inner side of the vacuum chamber. Further, an annular sleeve and an O-ring are arranged between an inner sidewall of the through hole and an outer peripheral surface of the gas injector in this order inside an inner area of the vacuum chamber. Then, an annular tool is pressed against the O-ring from an outer side of the vacuum chamber to an inner side of the vacuum chamber. Accordingly, by restraining the movement of the sleeve and O-ring with the inner wall surface of the through hole (more specifically, an upright surface extending from the inner wall surface to the outer peripheral surface of the gas injector throughout a circumferential direction), the O-ring becomes crushed (compressed), so that a space between the inner wall surface and the gas injector becomes hermetically (air-tightly) sealed. Then, one end of the flexible pipe is air-tightly inserted into the through hole, so that the end of the flexible pipe is positioned facing an open end of the gas injector provided inside the through hole. Thereby, there can be obtained a configuration that can supply gas into a vacuum chamber via the gas injector while the inside of the vacuum chamber is maintained to be air tight.

In a case where the above-described method is used for a configuration that supplies gas inside a vacuum chamber, it is necessary to maintain a sufficient space at an outer side of the vacuum chamber to the extent of handling the flexible pipe during attachment and detachment of the flexible pipe. This leads to increase of the footprint of the film deposition apparatus. Further, because the O-ring of the gas injector also serves as a sealing part of the vacuum chamber itself, the sealing part of the vacuum chamber is released to the atmosphere when the gas injector is detached. Therefore, in a case of, for example, detaching the gas injector for maintenance purposes, vacuum leak may occur due to maintenance. Such problems are not described in the above-described patent document 1.

SUMMARY OF THE INVENTION

The present invention may provide a gas processing apparatus that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a gas processing apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a gas processing apparatus for performing a process by supplying gas to a process target. The gas processing apparatus includes an air-tight process chamber including a wall part and configured to install the process target therein, a through-hole that is formed in the wall part and is air-tightly in communication with a gas supply pipe provided at an outer side of the process chamber, an injector that is inserted to the through-hole from an inner side of the process chamber and configured to supply the gas into the process chamber from the gas supply pipe, a sleeve engaged to an outer peripheral surface of the injector inside the through-hole, an annular sealing member engaged to the outer peripheral surface of the injector and provided inside the through-hole in a position more toward the outer side of the process chamber than the sleeve, an engagement surface that faces the sealing member and is formed in an annular shape along a wall surface of the through-hole in a position more toward the outer side of the process chamber than the sealing member, and a pressing part that is provided inside the process chamber and configured to press the sleeve toward the outer side of the process chamber. The pressing part is configured to compress the sealing member by exerting pressure to the engagement surface from an end surface of the sleeve toward the sealing member, so that an inside of the injector and an outside of the injector are air-tightly sealed.

Other objects and further features of the present invention will be apparent from the following detailed description when read in conjunction with the accompanying drawings.

DESCRIPTION OF THE EMBODIMENTS

Figure 1:
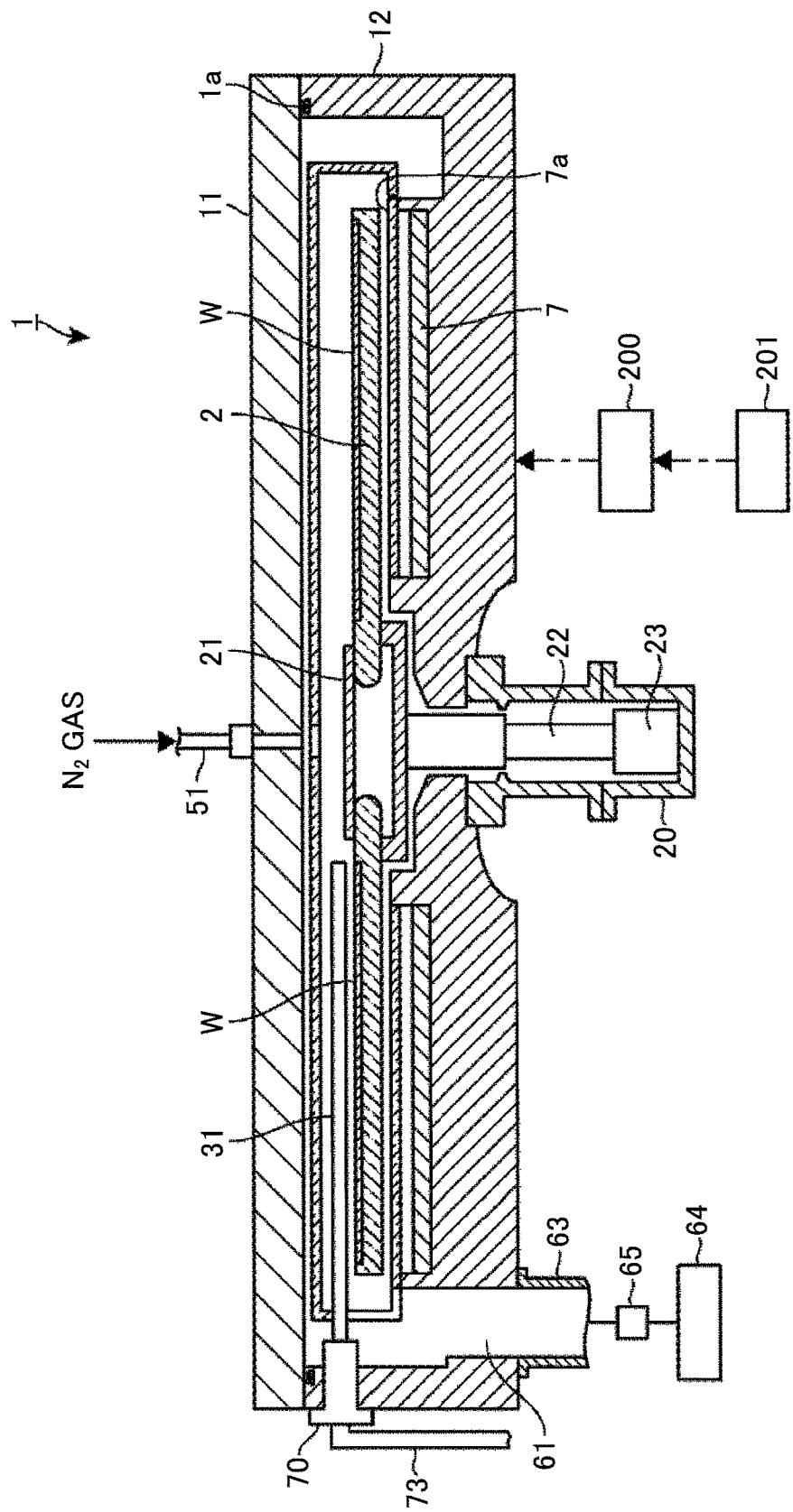
FIG. 1 is a vertical cross-sectional view illustrating a film deposition apparatus according to an embodiment of the present invention.
Figure 2:
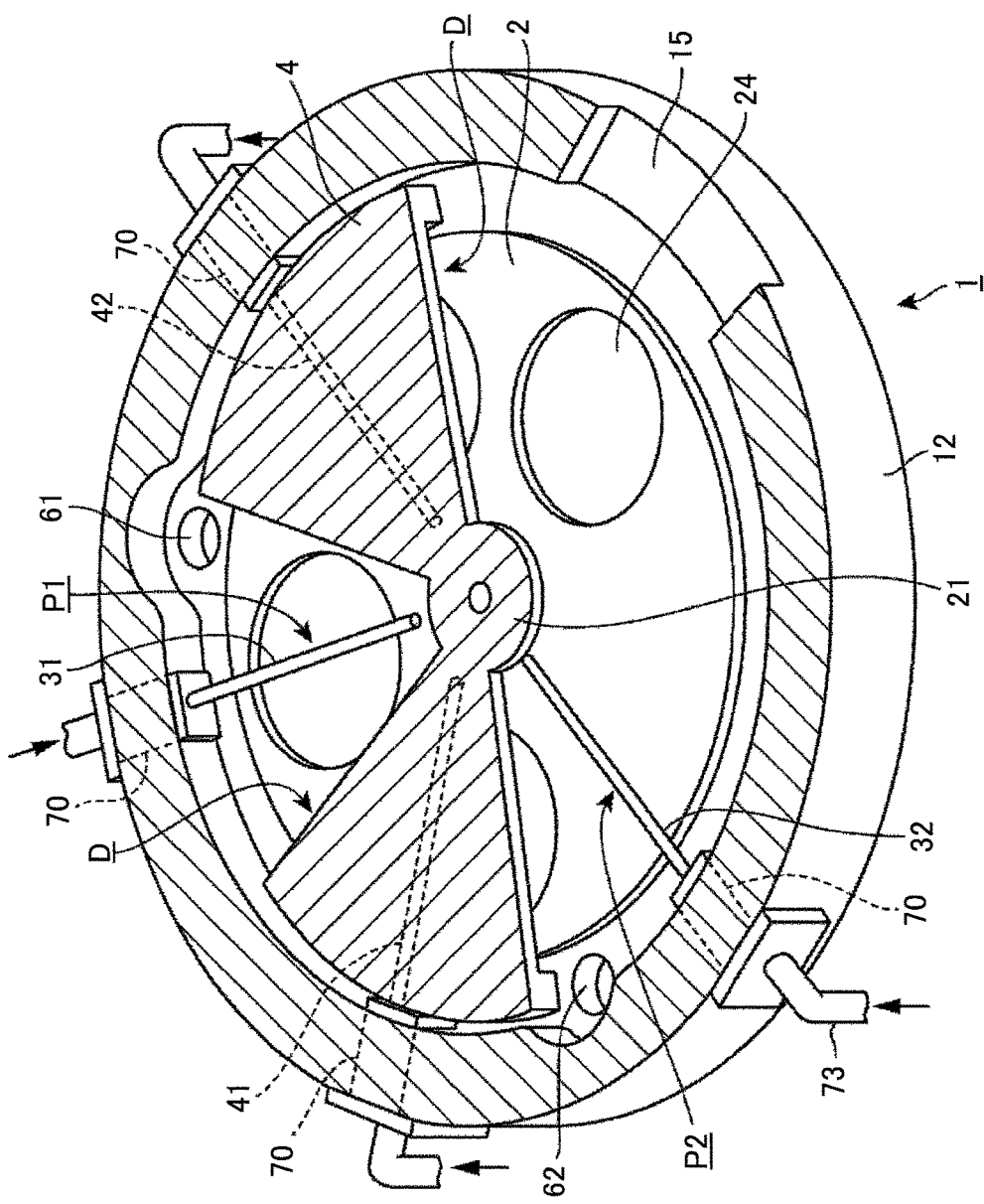
FIG. 2 is a perspective view illustrating the film deposition apparatus.
Figure 3:
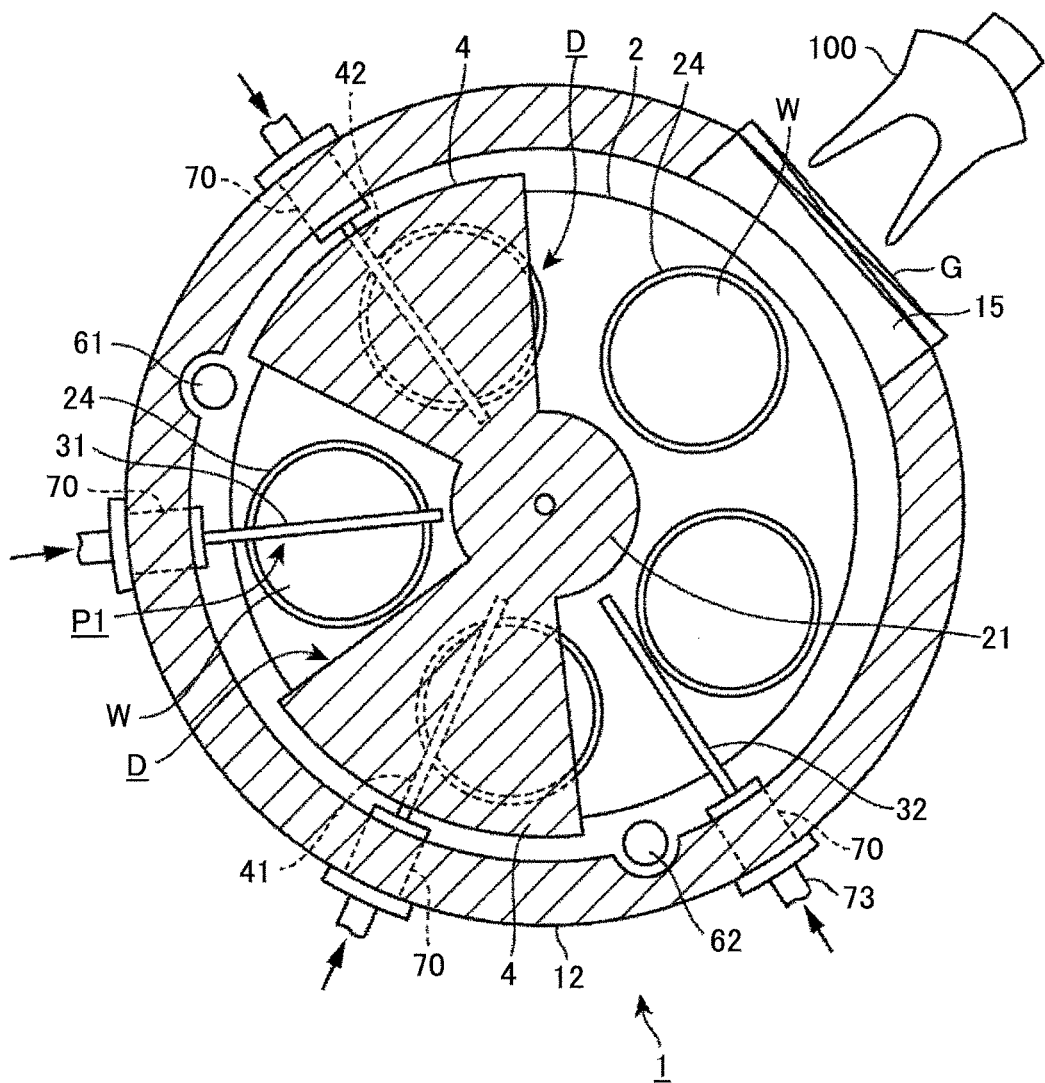
FIG. 3 is a horizontal cross-sectional view illustrating the film deposition apparatus.

In the following, an example of a gas processing apparatus being applied to a film deposition apparatus according to an embodiment of the present invention will be described with reference to FIGS. 1 to 7. As illustrated in FIGS. 1 to 3, the film deposition apparatus includes a vacuum chamber (process chamber) 1 having a substantially circular plan-view shape and a rotation table 2 being provided rotatably about a vertical axis inside the vacuum chamber 1. The film deposition apparatus is configured to perform a film deposition process by supplying a process gas from a gas injector to a wafer (process target) W provided on the rotation table 2. Then, as described below, the film deposition apparatus includes a structure having a satisfactory space saving feature, so that no additional space for attaching the gas injector need be provided at an outer side of the vacuum chamber 1. Next, a specific configuration of the film deposition apparatus is described.

As illustrated in FIG. 1, a separation gas supply nozzle 51 for supplying separation gas (e.g., $N_2$ (nitrogen) gas) is connected to a center part of a ceiling plate 11 of the vacuum chamber 1 for separating the below-described process areas P1, P2. A heater unit 7 serving as a heating part is provided at a lower side of the rotation table 2. The heater unit 7 is configured to heat the waver W to a temperature of, for example, 300° C. to 600° C. by way of the rotation table 2. Reference numeral 7a indicates a cover member formed of, for example, quartz. The cover member 7a is provided with a box-like shape that covers a periphery of the rotation table 2. The cover member 7a is formed in a manner avoiding the below-described evacuation ports 61, 62 and being arranged along a lower surface of the ceiling plate 11. A purge gas supply pipe (not illustrated) is connected to a bottom surface side of the vacuum chamber for supplying nitrogen gas to an area where the heater unit 7 is provided. Reference numeral 1a of FIG. 1 is a sealing member (e.g., O-ring) provided on an upper end surface of the sidewall 12 of the vacuum chamber 1.

The rotation table 2 is formed of, for example, quartz. The rotation table 2 is fixed to a center part of a core part 21 having a substantially circular cylinder shape. The rotation table 2 is configured to be rotated about a vertical axis (in this embodiment, clockwise direction) by a rotation shaft 22 connected to a bottom surface of the core part 21. Reference numeral 23 of FIG. 1 represents a driving part (rotation mechanism) that rotates the rotation shaft 22 around a vertical axis. Reference numeral 20 represents a case body in which the rotation shaft 22 and the driving part 23 are installed. A purge gas supply pipe (not illustrated) is connected to the case body 20, so that inert gas (e.g., nitrogen gas) is purged to an area where the rotation shaft 22 is provided.

As illustrated in FIGS. 2 and 3, recess parts 24 are formed in multiple areas (in this embodiment, 5 areas) along a rotation direction (circumferential direction) of the rotation table 2. The recess parts serve as substrate receiving regions for receiving wafers W having a diameter of, for example 300 mm. Four nozzles (gas injectors) 31, 32, 41, 42 (formed of, for example, quartz) are provided at angular intervals along the circumferential direction of the vacuum chamber 1. The nozzles 31, 32, 41, 42 are attached in a manner horizontally extending in a direction from the circumferential wall of the vacuum chamber 1 to a center part of the vacuum chamber 1. In this example, the nozzles 31, 32, 41, and 42 correspond to a first process gas nozzle, a second process gas nozzle, a separation nozzle, and another separation nozzle, respectively. In the illustrated example, the second process gas nozzle 32, the separation nozzle 41, the first process gas nozzle 31, and the separation nozzle 42 are arranged in this order along a clockwise direction from the below-described transfer opening 15. Gas ejection holes (not illustrated) are formed in multiple parts of, for example, a lower surface side of the gas nozzles 31, 32, 41, and 42 along the radial direction of the rotation table 2.

Figure 4:
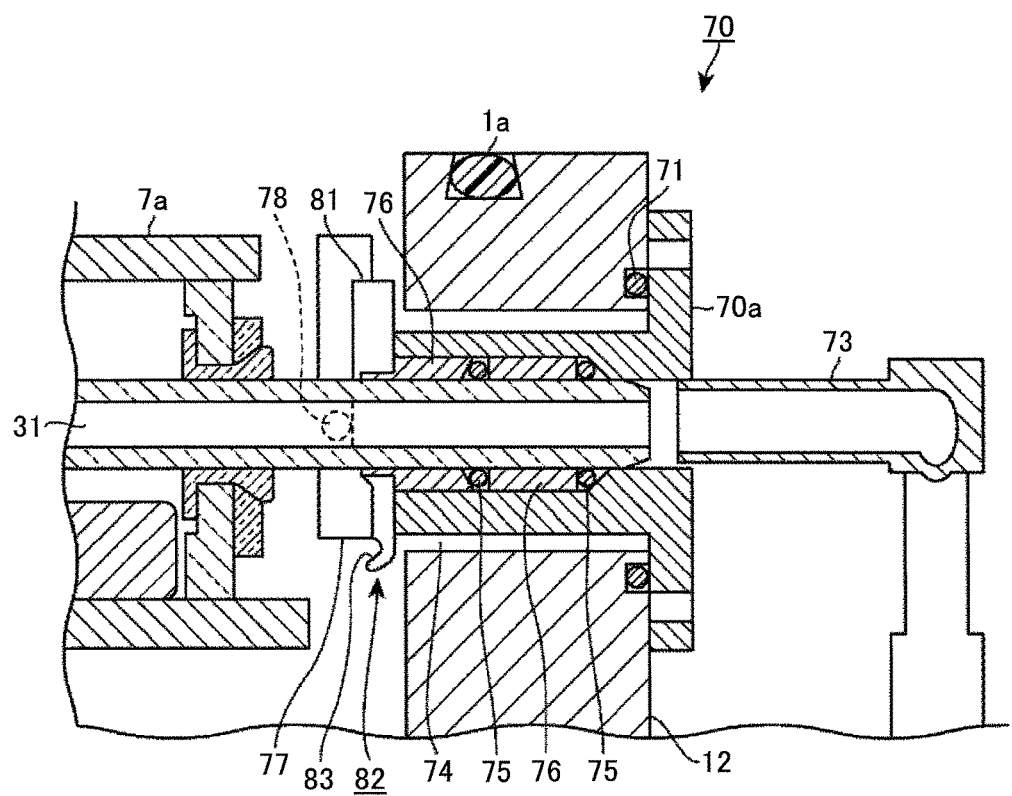
FIG. 4 is a vertical cross-sectional view illustrating an attachment structure of a nozzle provided in the film deposition apparatus.
Figure 5:
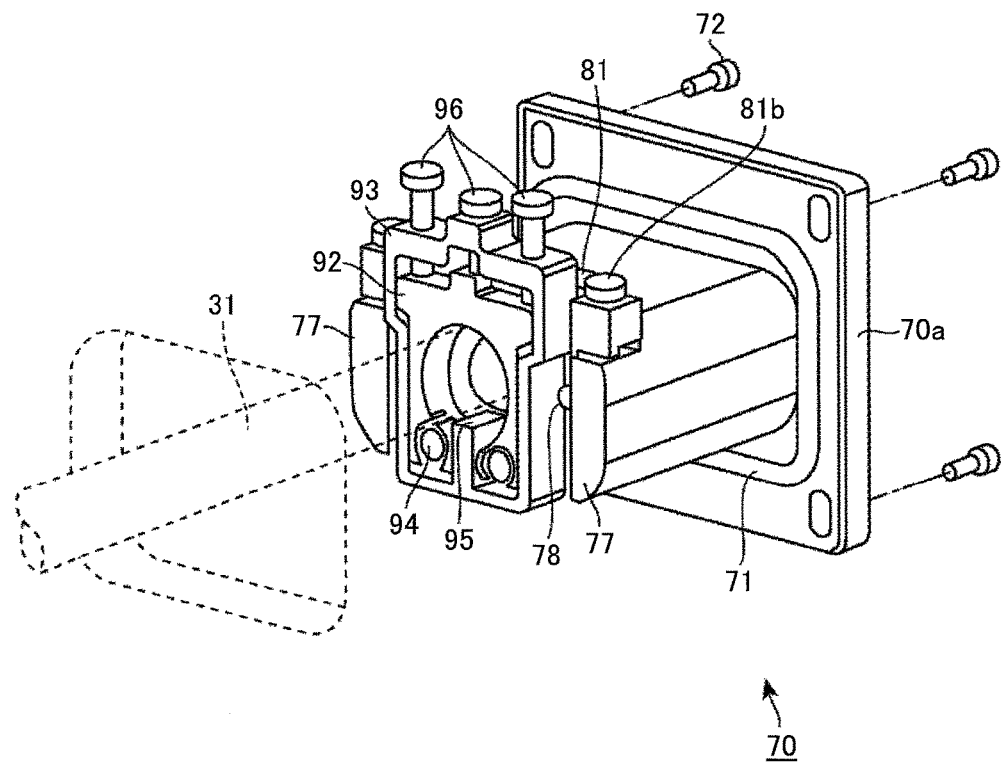
FIG. 5 is a perspective view illustrating the attachment structure.

Next, a configuration and method for attaching each of the gas nozzles 31, 32, 41, and 42 to the vacuum chamber 1 are specifically described using the first process gas nozzle 31 as a representative example. As illustrated in FIGS. 1-3, a gas supply port 70 is air-tightly attached from an outer side of the vacuum chamber to a base end of the gas nozzle 31 (toward the sidewall 12 of the vacuum chamber 1) in a manner penetrating the sidewall 12. More specifically, the gas supply port 70 has a substantially square cylinder shape extending in a radial direction of the rotation table 2. The square cylinder part of the gas supply port 70 forms a part of a wall of the vacuum chamber 1. As illustrated in FIGS. 4 and 5, an end part of the gas supply port 70 provided at an outer side of the vacuum chamber 1 is a flange part 70a extending in a flange-like manner in a horizontal direction.

Figure 6:
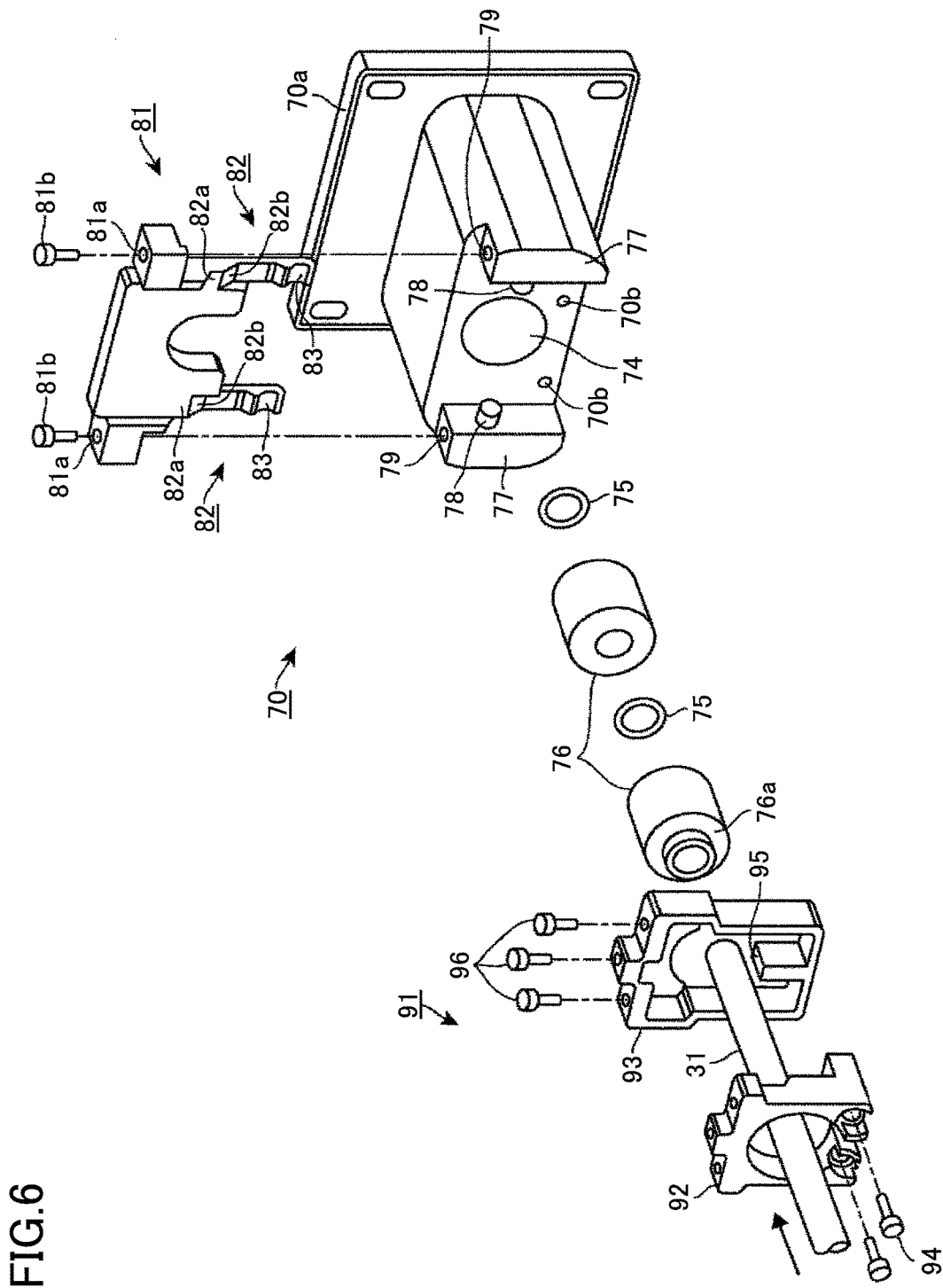
FIG. 6 is an exploded perspective view illustrating the attachment structure.
Figure 7:
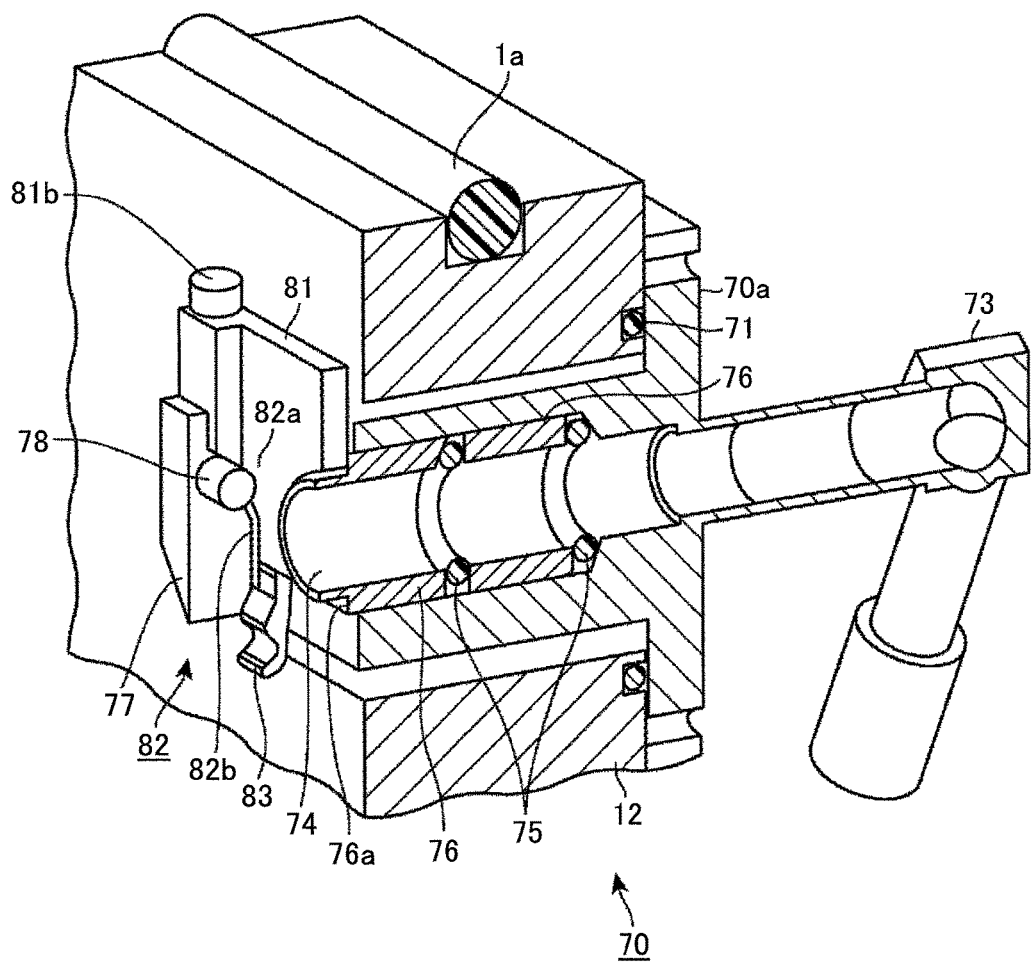
FIG. 7 is a perspective view illustrating a vertical cross section of the attachment structure.

A sealing member 71 (e.g., O-ring) is provided in an outer wall surface of the vacuum chamber 1 in a manner surrounding an area to which the gas supply port 70 is inserted. By fixing the flange part 70a to the outer wall surface of the vacuum chamber 1 by way of a bolt 72, the gas supply port 70 can be air-tightly attached to the vacuum chamber 1. Reference numeral 73 illustrated in, for example, FIG. 4 represents a gas supply path for supplying process gas into the vacuum chamber 1 via the gas supply port 70. The gas supply path 73 extends vertically downward from a rear surface side of the flange part 70a. As illustrated in FIGS. 6 and 7, an insertion hole (through hole) 74 is formed in a surface of the gas supply port 70 on a side toward an inner area of the vacuum chamber 1. The gas nozzle 31 is to be inserted into the insertion hole 74 from a base end side of the gas nozzle 31. As illustrated in FIG. 4, the sealing member 75 (e.g., O-ring) is provided between an inner peripheral surface of the insertion hole 74 and an outer peripheral surface of the gas nozzle 31, so that the sealing member 75 is engaged to the outer peripheral surface of the gas nozzle 31. A diameter of the insertion hole 74 is reduced to be smaller than an inner diameter of the gas nozzle 31, so that an inner peripheral surface of the insertion hole 74 toward the side of the flange part 70a serves as an annular opposed surface (engagement surface) that faces the sealing member 75 along an outer peripheral surface of the gas nozzle 31. Reference numeral 31 illustrated in FIG. 6 indicates a screw hole for fastening the below-described bolt 94 thereto. It is to be noted that, FIGS. 4 and 7 illustrate a state where the vacuum chamber 1 is vertically cut with respect to a longitudinal direction of the gas nozzle 31 (gas supply port 70).

An annular sleeve 76 for pressing (fastening) the sealing member 75 with respect to the flange part 70a is provided more toward the rotation table 2 than the sealing member 75 in a manner that the sleeve 76 engages the outer peripheral surface of the nozzle 31. Then, in a state where the nozzle 31 is accommodated inside the sealing member 75 and the sleeve 76, the nozzle 31 is configured to air-tightly contact the inner peripheral surface (opposed surface) of the insertion hole 74 via the sealing member 75 when the sealing member 75 is extended in a vertical direction by fastening the sleeve 76 to the sealing member 75.

In this example, the combinations of the sealing member 75 and the sleeve 76 are positioned next to each other in a horizontal direction in two areas. Supposing the sleeve 76 positioned toward the flange part 70a is referred to as an "outer side sleeve 76" and the sleeve 76 positioned toward the rotation table 2 is referred to as an "inner side sleeve", apart of the inner side sleeve 76 toward the nozzle 31 on the side of the rotation table 2 projects to the inner area of the vacuum chamber 1. A surface of the inner side sleeve 76 that is positioned on the side of the rotation table 2 and extends from the projecting part to an outer peripheral surface side of the inner side sleeve 76 is referred to as a "slide surface 76a". The slide surface 76a is parallel to a vertical plane and positioned closer to the rotation table 2 than an end surface of the gas supply port 70 on the side of the rotation table 2. The slide surface 76a serves as a target pressing surface to which pressure is exerted from the below-described fastening member 81.

Projecting parts 77 that project toward the rotation table 2 are provided on the end surface of the gas supply port 70 on the side of the rotation table 2. The projecting parts 77 are arranged on the left and right sides (upstream and downstream sides with respect to the rotating direction of the rotation table 2) of an end opening of the insertion hole 74, so that the end opening of the insertion hole 74 is interposed therebetween. As illustrated in FIG. 6, circular cylindrical-shaped pins 78 serving as restraining parts are formed on the surfaces of the projecting parts 77 toward the insertion hole 74 and extend in a manner facing each other. The pins 78 are formed to be parallel to each other and face a horizontal direction. The pins 78 serve as target guiding parts that are guided by the below-described slope surfaces 82b. Screw holes 79 are formed in the upper surfaces of the projecting parts 77 for allowing the below-described fixing members (screw members) 81b to be inserted therein.

A substantially planar-shaped fastening member 81 is provided as a pressing member in a position more toward the rotation table 2 than the insertion hole 74. A substantially circular-shaped opening is formed in a lower end side of the fastening member 81 into which the gas nozzle 31 is arranged. The fastening member 81 is movable in upward and downward directions by rotating (fastening or loosening) the below-described fixing members 81b. A surface on the rear side of the fastening member 81 (side toward the gas supply port 70) serves as a pressing surface for exerting pressure to the sealing member 75. The surface on the rear side of the fastening member 81 extends in a vertical direction. That is, the surface on the rear side of the fastening member 81 is arranged to be parallel to the slide surface 76a. The fastening member 81 and the pins 78 constitute a pressing part. It is to be noted that, FIG. 6 illustrates the fastening member 81 separated from the gas supply port 70 and positioned more upward than the gas supply port 70.

Arm parts 82 that extend downward are formed on left and right sides of the nozzle 31 in a lower surface part of the fastening member 81. A surface on the side of the rotation table 2 of each arm part 82 includes a vertical surface 82a and a slope surface 82b arranged in this order from an upper to bottom side of the arm part 82. The vertical surface 82a extends in a vertical direction (operating direction of the fastening member 81) along the slide surface 76a. The slope surface 82b is formed along a direction that intersects the direction in which the nozzle 31 extends. The slope surface 82b is formed as a guiding surface for guiding the fastening member 81 along an outer peripheral surface of the pin 78. The slope surface 82b extends toward a rear surface side of the fastening member 81 from a lower end of the vertical surface 82a. That is, the slope surface 82b has a configuration in which a vertical surface portion of the arm part 82 extending in a vertical direction along, for example, a sidewall of the vacuum chamber 1 has its upper end inclined toward the rotation table 2. A recess part 83 that serves as a retreat part is formed on a surface on the side of the rotation table 2 of each arm part 82 below the slope surface 82b for engaging with the outer peripheral surface of the pin 78. Further, opening parts 81a are formed on the left and right sides of the upper surface of the fastening member 81. The fixing members 81b are to be loosely fitted to the opening parts 81a for attaching the fixing members 81b to corresponding attachment holes 79. A method for air-tightly contacting the nozzle 31 and the gas supply port 70 by way of the fastening member 81 is described below.

Figure 8:
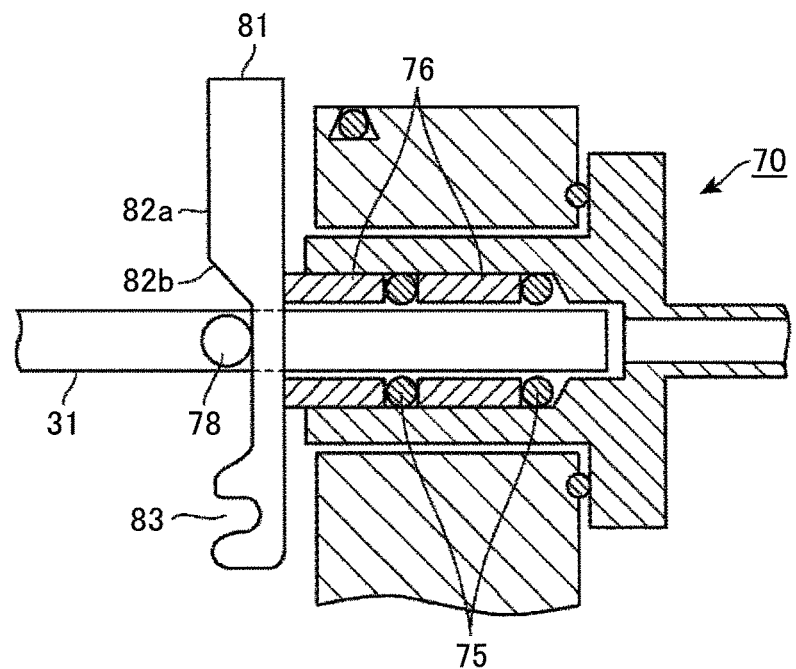
FIG. 8 is a diagram illustrating an action of attaching a nozzle to a vacuum chamber by using the attachment structure.

As illustrated in FIG. 8, two pairs of the seal member 75 and the sleeve 76 are provided inside the insertion hole 74. When the nozzle 31 is inserted into the sealing member 75 or the sleeve 76, a part of the inner sleeve 76 on the side of the rotation table (slide surface 76a) projects more toward the side of the rotation table 2 than the sidewall 12 of the vacuum chamber 1. The length in which the inner sleeve 76 projects is set to correspond to, for example, the length (e.g., 1 mm to 2 mm) in which the sealing member 75 is compressed (crushed) by the sleeve 76. Further, the position of the fastening member 81 is set, so that a part between the slope surface 82b and the recess part 83 of the fastening part 81 is positioned between the pin 78 and the inner sleeve 76. In this state, the nozzle 31 does not air-tightly contact the gas supply port 70.

Figure 9:
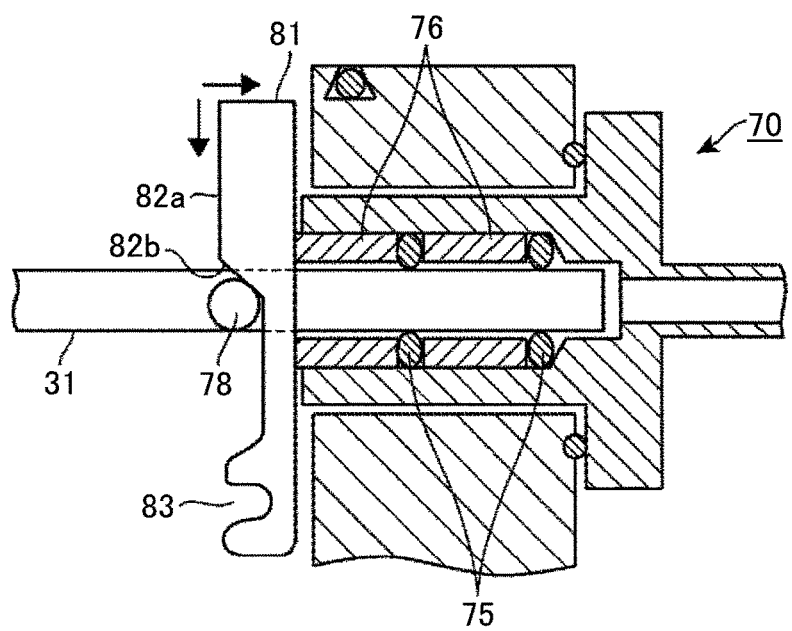
FIG. 9 is a diagram illustrating an action of attaching a nozzle to a vacuum chamber by using the attachment structure.
Figure 10:
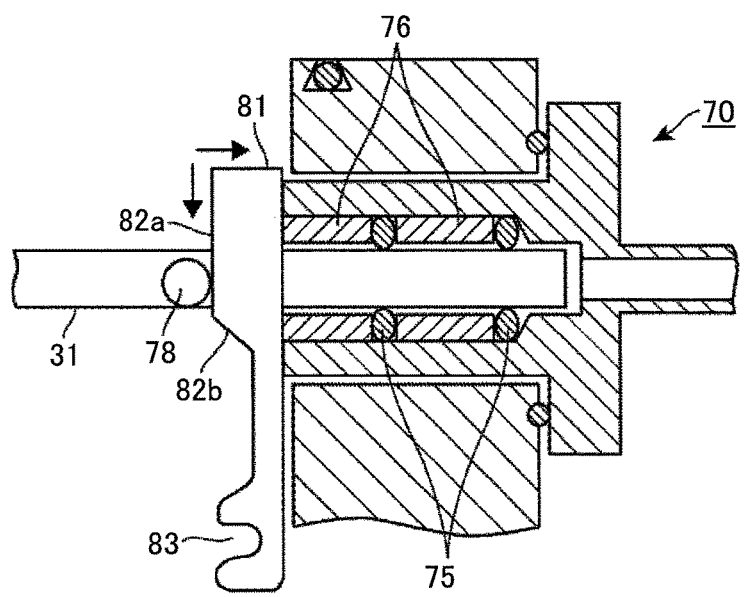
FIG. 10 is a diagram illustrating an action of attaching a nozzle to a vacuum chamber by using the attachment structure.

Then, as illustrated in FIG. 9, the slope surface 82 contacts the outer peripheral surface of the pin 78 when the fastening member 81 is lowered. Then, the fastening member 81 is lowered along the slide surface 76a and moved toward the gas supply port 70 while having its downward movement regulated by the pin 78. That is, the fastening member 81 is pressed into the area between the pin 78 and the sleeve 76. Accordingly, the pin 78 is moved in a manner running over the slope surface 82b. Thus, the sealing member 75 is compressed in a longitudinal direction of the nozzle 31 because the sleeve 76 is pressed toward the sealing member 75. Thereby, the sealing member 75 expands in a direction orthogonal to the longitudinal direction of the nozzle 31. As the fastening member 81 is further lowered and runs over the slope surface 82b (see FIG. 10), the slide surface 76a overlaps, for example, the end opening of the insertion hole 74. Thereby, the nozzle 31 and the gas supply port 70 air-tightly contact each other via the sealing member 75. Further, because the pin 78 is in a state contacting the vertical surface 82a that is parallel to the slide surface 76a, the fastening member 81 is prevented from moving in upward and downward directions. In other words, the movement of the fastening member 81 is locked.

The above-described lowering movement of the fastening member 81 is caused by the fastening of the fixing members 81b. Therefore, because the projecting part 77 and the fastening member 81 are fixed to each other by way of the fixing members 81b, the vertical movement of the fastening member 81 is not only prevented by the pin 78 that runs over the vertical surface 82a but also by the fastening of the projecting part 77 and the fastening member 81b. That is, the degree in which the movement of the fastening member 81 is locked can be increased.

Figure 11:
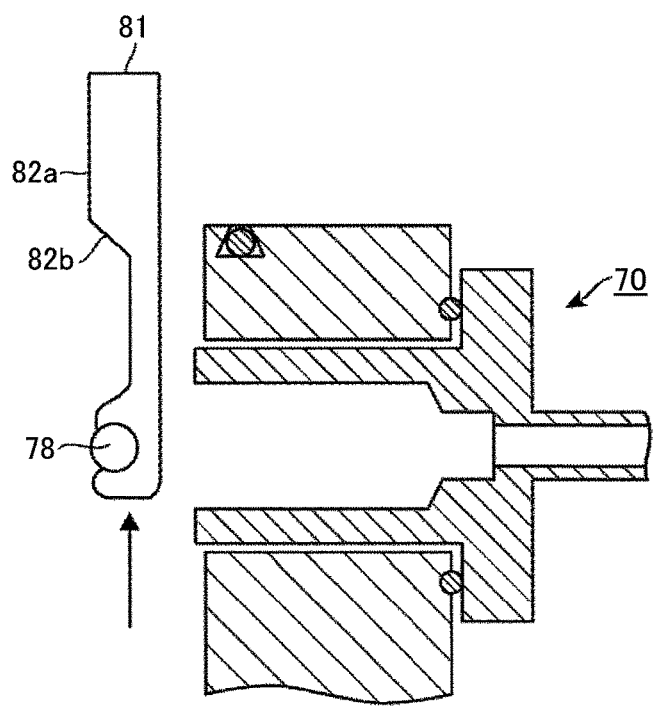
FIG. 11 is a diagram illustrating an action of attaching a nozzle to a vacuum chamber by using the attachment structure.

Then, in a case of, for example, removing the nozzle 31, the pin 78 and the recess part 83 can be engaged with each other, so that the nozzle is retreated and prevented from interfering with the fastening member 81 as illustrated in FIG. 11. Similar to the above-described nozzle (first process gas nozzle 31), the other process gas nozzles 32, 41, 42 are also configured to be attached to the vacuum chamber 1 by way of the fastening member 81.

Then, returning to the description of the configuration of the film deposition apparatus, an inclination angle adjustment member 91 is provided at a position more toward the rotation table 2 than the inner sleeve 76. The inclination angle adjustment member 91 is for adjusting an inclination angle of the nozzle 31 relative to the rotation table 2. More specifically, the inclination angle adjustment member 91 includes a body part 92 provided in a manner encompassing the nozzle 31 and a frame member 93 provided at the outer side of the body part 92. The body part 92 is formed to be fastened to the above-described screw hole 70b of the gas supply port 70 by way of the bolt 94. Meanwhile, the frame member 93 is configured to have its height adjusted with respect to the body part 92 by way of a bolt 96. Further, the frame member 93 includes a support surface 95 that supports a lower surface of the nozzle 31. Accordingly, the inclination angle of the nozzle 31 can be adjusted by raising and lowering the frame member 93 with respect to the body part 92. More specifically, by raising the frame member 93 with respect to the body part 92, a front end of the nozzle 31 can be raised. On the other hand, the front end of the nozzle 31 can be lowered by lowering the frame member 93 with respect to the body part 92. The inclination angle adjustment member 91 is also provided in correspondence with each the nozzles 32, 41, and 42. It is to be noted that, for the sake of convenience, the inclination angle adjustment member 93 is not illustrated in the drawings except for FIGS. 5 and 6.

The first process gas nozzle 31 is connected to a source for supplying a first process gas containing Si (silicon). The second process gas nozzle 32 is connected to a source for supplying a second process gas containing ozone ($O_3$). The area below the process gas nozzles 31 is a first process area P1 at which the first process gas is adsorbed to the wafer W. The area below the process gas nozzle 32 is a second process area P2 at which a reaction is created between the first process gas adsorbed to the wafer W and the second process gas.

The separation gas nozzles 41, 42 are for separating the first process area P1 from the second process area P2, to thereby form a separation area D. Each of the separation gas nozzles 41, 42 are connected to a source for supplying a separation gas of nitrogen. In the separation area D, a sector-shaped convex portion 4 is provided in the ceiling plate 11 of the vacuum chamber 1 for preventing each of the process gases from mixing with each other. More specifically, the convex portion 4 has a low flat ceiling provided with the convex portion 4 having a substantially sector shape from a plan view. The separation gas nozzles 41, 42 are installed inside the convex portion 4, respectively.

As illustrated in FIG. 1, the evacuation ports 61, 62 are formed in correspondence with first and second process areas P1, P2, respectively, at a bottom surface part of the vacuum chamber 1 at the outer peripheral side of the rotation table 2. The first evacuation port 61 is provided between the first process area P1 and the separation area D located downstream of the rotation direction of the rotation table 2 with respect to the first process area P1. The second evacuation port 62 is provided between the second process area P2 and the separation area D located downstream of the rotation direction of the rotation table 2 with respect to the second process area P2. As illustrated in FIG. 1, an evacuation mechanism such as a vacuum pump 64 is connected to evacuation pipes 63 extending from corresponding first and second evacuation ports 61, 62 via a pressure adjustment part 65 such as a butterfly valve.

As illustrated in FIGS. 2 and 3, a transfer opening 15 is formed in a sidewall of the vacuum chamber 1 for conveying the wafer W between an external transfer arm 10 and the rotation table 2. The transfer opening 15 for raising/lowering the wafer W can be air-tightly opened and closed by a gate valve G. Further, elevation pins (not illustrated) may be provided below the rotation table 2 in an area corresponding to the transfer opening 15.

The film deposition apparatus includes a control part 200 including a computer for controlling operations of the entire film deposition apparatus. The control part 200 has a memory in which a program for causing the control part 200 to perform the below-described film deposition process is stored. A group of steps are assembled to the program for executing the operations of the film deposition apparatus. The program is read out and loaded in the control part 200 from a storage part 201 including a recording medium such as a hard disk, a compact disk, a magneto-optical disk, a memory card, or a flexible disk.

Next, effects of the film deposition apparatus according to an embodiment of the present invention are described. First, as described above, the nozzles 31, 32, 41, 42 are attached to the vacuum chamber 1 and have their inclination angles adjusted. Then, the gate valve G is opened. Then, one or more wafers (in this embodiment, 5 wafers) are sequentially mounted on the rotation table 2 by the transfer arm 15 via the transfer opening 15 while intermittently rotating the rotation table 2. Then, the gate valve G is closed, so that the inside of the vacuum chamber 1 is evacuated by the vacuum pump 64. Further, the rotation table 2 is rotated in, for example, a clockwise direction. Further, the wafers W are heated by the heater unit 7.

Then, process gases are ejected from the first and the second process gas nozzles 31, 32. Further, separation gases (nitrogen gases) are ejected from the first and the second separation gas nozzles 41, 42 at a predetermined flow rate. Then, the pressure inside the vacuum chamber 1 is adjusted to a predetermined processing pressure by the pressure adjustment valve 65. Then, components of the first process gas are adsorbed to the surface of the wafer W inside the first process area P1. Thereby, an adsorption layer is generated on the surface of the wafer W. Meanwhile, a reaction is created between the first process gas adsorbed to the wafer W and the second process gas inside the second process area P2. Thereby, a reaction product (silicon oxide) is generated. By continuing the rotation of the rotation table 2, the adsorption of the adsorption layer and the reaction of the adsorption layer repeated many times in this order. Thereby, a layered thin film having many layers of reaction products can be formed.

Further, because nitrogen gas and separation are supplied between the first process area 21 and the second process area P2, the first process gas and the second process gas can be evacuated without mixing with each other. Further, because purge gas is supplied to the area below the rotation table 2, gases can be prevented from spreading in the area below the rotation table 2 by being forced toward the evacuation ports 61, 62.

Then, as described with FIG. 11, the sealing member 75, the sleeve 76, or the like are removed by raising the fastening member 81 in a case of removing the nozzles 31, 32, 41, 42 for the purpose of, for example, maintenance. As it can be understood from FIG. 11, there is no need to remove the gas supply port 70. Therefore, there is no need for preparing a space for handling the gas supply path 73.

With the above-described embodiment, in a case of air-tightly attaching the nozzle 31 to the vacuum chamber 1 with the sealing member 75, the fastening member 81 used for fastening the sealing member 75 is provided inside the vacuum chamber 1. In a case of fastening the sealing member 75 with the fastening member 81, the moving direction of the fastening member 81 is set to intersect (perpendicularly intersect) with respect to the direction in which the nozzle 31 extends. Even in a case where the inside of the vacuum chamber 1 has little additional space due to the nozzles 31, 32, 41, 42 and other components, the fastening member 81 can be movably installed in the vacuum chamber 1. Accordingly, size reduction of the film deposition apparatus can be achieved by reducing the footprint of the film deposition apparatus because a space for handling the gas supply path 73 need not be provided outside the vacuum chamber 1. Further, the gas supply port 70 need not be detached in a case of removing the nozzles 31, 32, 41, and 42 for maintenance. Accordingly, residue attached to the inside of the gas supply path 73 can be prevented from scattering. Thus, generation of particles can be prevented. Because the sealing member 75 is prevented from being exposed to the atmosphere during maintenance, vacuum leakage can be prevented from occurring during maintenance.

With the above-described film deposition apparatus, the nozzles 31, 32, 41, 42 are radially arranged from a plan view. Therefore, in a case where the method/apparatus according to the above-described embodiment of the present invention is not implemented, a ring-like space (space for handling the gas supply path 73) that is one size larger than the film deposition apparatus is to be provided. On the other hand, a significant effect can be attained by implementing the method/apparatus of the above-described embodiment of the present invention because a space one size larger than the film deposition apparatus can be saved.

Next, a case of air-tightly attaching the nozzle 31 to the vacuum chamber 1 of a related art configuration is briefly described with reference to FIG. 12. Apart of the gas supply port 70 toward the rotation table 2 has its diameter reduced to correspond to the opposed surface of the sealing member 75. The gas supply path 73 is detachably attached to the gas supply port 73. The gas supply part 73 has the outer sleeve 76 tightened around the sealing member 75 encompassing the nozzle 31. Accordingly, as described above, a space for handling the gas supply path 73 needs to be provided outside the vacuum chamber 1 in a case of attaching/detaching the nozzle 31. Further, because the gas supply path 73 is formed with, for example, a flexible bellows pipe, residue adhered to the inside of the gas supply path 73 may scatter whenever the gas supply path 73 is handled.

Figure 12:
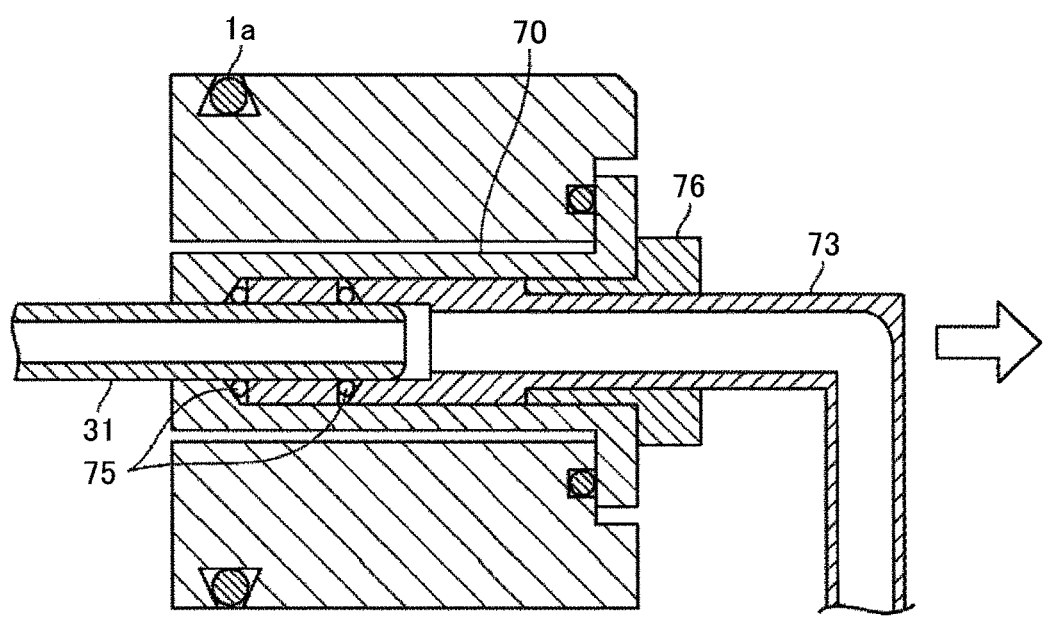
FIG. 12 is a vertical cross-sectional view illustrating a conventional attachment structure.

Further, in FIG. 12, the sealing member 75 encompassing the nozzle 31 not only serves to air-tightly seal the space between the nozzle 31 and the vacuum chamber 1 but also serves to seal the entire vacuum chamber 1. That is, in a case of removing the nozzle 31 and the gas supply path 73 during replacement of the nozzle 31, the sealing member 75 is exposed to the atmosphere. Therefore, in a case of assembling the film deposition apparatus in a state where residue is adhered to the sealing member 75 during maintenance, leakage of the vacuum sealed state may be caused by the sealing member 75. On the other hand, with the configuration of the above-described embodiment of the present invention, the sealing member 75 encompassing the nozzle 31 does not play the role of sealing the entire vacuum chamber 1. Therefore, even in a case of replacing the nozzle 31 for maintenance, vacuum leakage can be prevented from occurring in the vacuum chamber 1.

Figure 13:
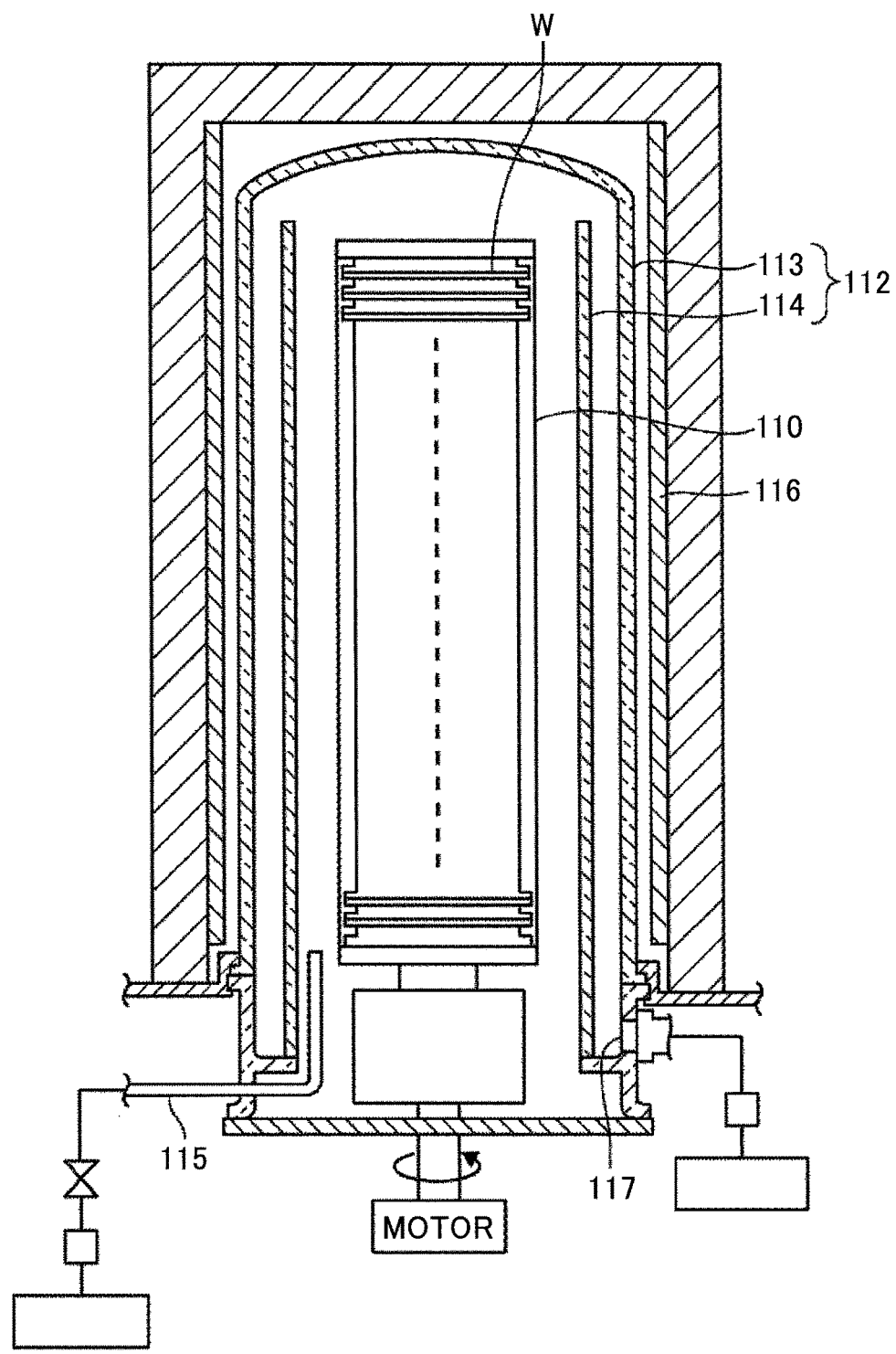
FIG. 13 is a vertical cross-sectional view illustrating a thermal processing apparatus that is an application example of a gas processing apparatus according to an embodiment of the present invention.

In the above-described embodiment of the present invention is applied to a semi-batch type film deposition apparatus including the nozzles 31, 32, 41, and 42, the above-described embodiment of the present invention may also be applied to a batch type thermal process apparatus that performs thermal processing on many wafers W (e.g., approximately 150 wafers) in a batch. More specifically, as illustrated in FIG. 13, the thermal process apparatus includes a wafer board 110 having many wafers W stacked in racks, and a reaction pipe (process chamber) 112 that has the wafer board 110 installed therein. The reaction pipe 112 is a so-called dual pipe including an outer pipe 113 and an inner pipe 114. The reaction pipe 112 also includes a gas injector 115 that extends from a lower side of the reaction pipe 112 to the inside of the inner pipe 114. In FIG. 13, reference numeral 116 indicates a heater, and reference numeral 117 indicates an evacuation port.

Figure 14:
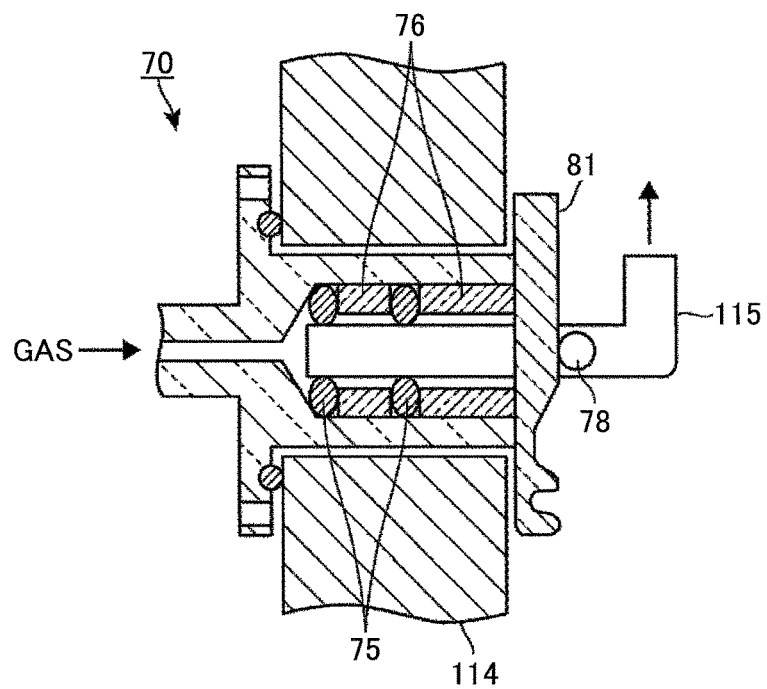
FIG. 14 is a vertical cross-sectional view illustrating an attachment structure of a gas injector of the thermal processing apparatus.

Even with this batch type thermal processing apparatus, the above-described gas supply port 70 including the pins 78 and the fastening member 81 is provided at a sidewall part of the reaction pipe 112 to which the gas injector 115 is attached as illustrated in FIG. 14. In this thermal processing apparatus, a thermal process is performed by supplying process gas to each wafer in a vacuum or an atmospheric pressure environment. Even with this batch type thermal processing apparatus, the same effects can be attained as those of the film deposition apparatus of the above-described embodiment of the present invention can be attained. In FIGS. 13 and 14, like components are denoted with like reference numerals as those of the above-described embodiment and are not further explained.

Figure 15:
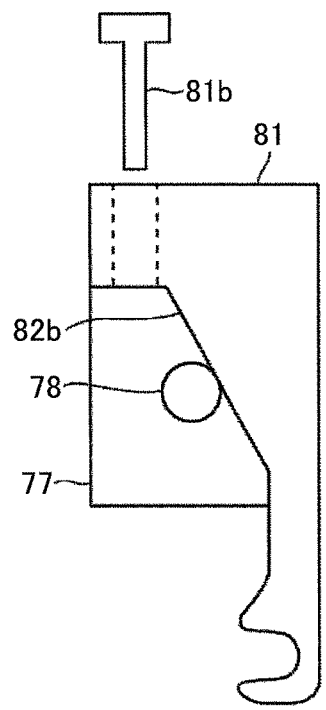
FIG. 15 is a vertical cross-sectional view schematically illustrating another example of the attachment structure.

Next, other examples of the fastening member 81 are described. FIG. 15 illustrates an example of the fastening member 81 that is formed without the vertical surface 82a and is formed only with the slope surface 82b. That is, as illustrated in FIG. 15, the fastening member 81 is fixed to the projecting part 77 by way of the fixing part 81b. Accordingly, the fastening member 81 may be provided without the vertical surface 82a and use the fixing member 81b as a mechanism for locking the raising/lowering of the fastening member 81. Therefore, in a case of forming the vertical surface 82a in the fastening member 81, the fixing member 81b need not be provided in the fastening member 81.

Figure 16:
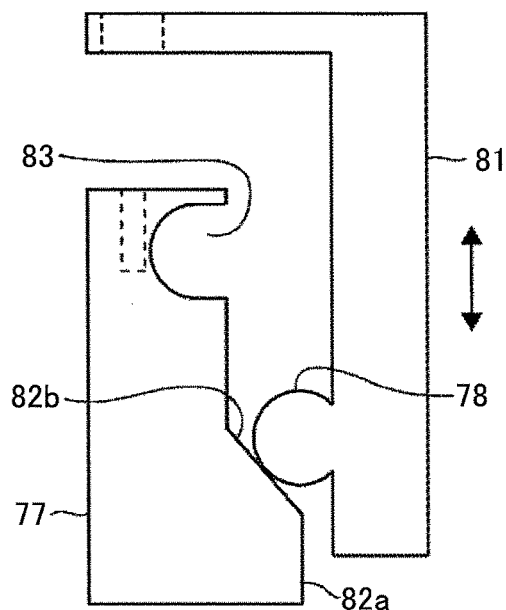
FIG. 16 is a vertical cross-sectional view schematically illustrating yet another example of the attachment structure.

FIG. 16 illustrates an example in which the vertical and slope surfaces 82a, 82b are provided in the projecting member 77 whereas the pin 78 is provided in the fastening member 81. The recess part 83, the slope surface 82b, and the vertical surface 82a are provided from an upper side to a lower side of the projecting member 77 in this order. Further, the pin 78 is formed toward a center part of the fastening member 81 from the upper and lower ends of the fastening member 81. In this example, the pin 78 is formed in a lower end part of the fastening member 81.

When moving the pin 78 downward along the slope surface 82b according to this example of FIG. 16, the pin 78 moves toward the gas supply port 70 as the fastening member 81 is lowered. In addition, the fastening member 81 is prevented from being further lowered at the vertical surface 82a. Further, the fastening member 81 retreats to a retreat position by installing the pin 78 in the recess part 83.

Figure 17:
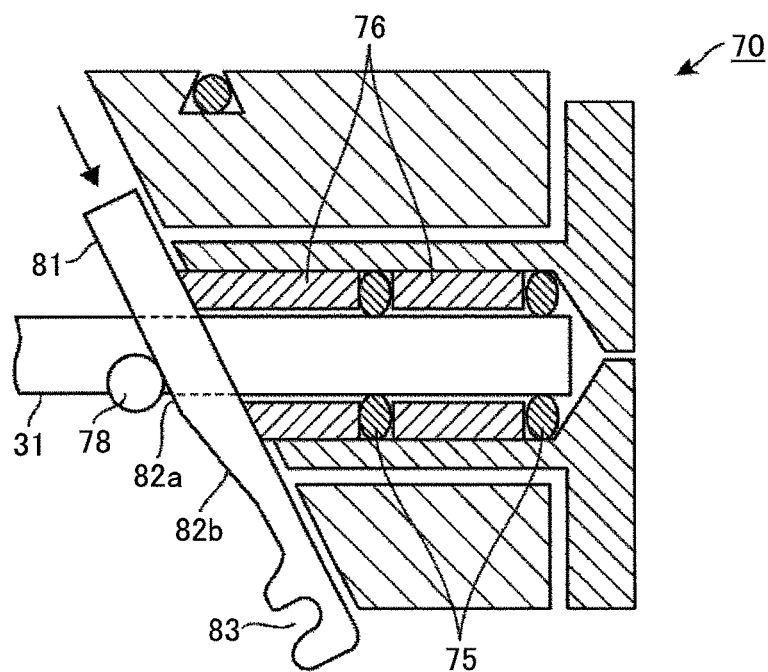
FIG. 17 is a vertical cross-sectional view schematically illustrating another example of the attachment structure.

FIG. 17 illustrates an example in which the moving direction of the fastening member 81 intersects with the extending direction of the nozzle 31. That is, the inner wall surface of the vacuum chamber 1 is inclined with respect to the vertical surface 82b in a manner extending from the upper to lower side and separating from the rotation table 2. Further, the slide surface 76a of the inner sleeve 76 is also formed along the inner wall surface. With this configuration, the fastening member 81 moves downward along the slide surface 76a to air-tightly connect the nozzle 31 and the gas supply port 70.

Figure 18:
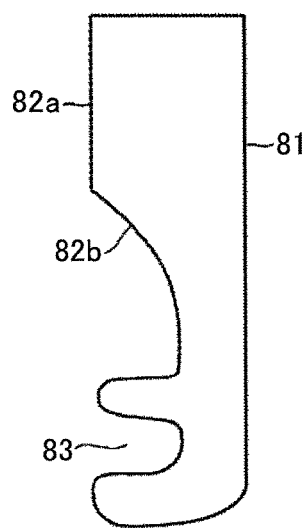
FIG. 18 is a vertical cross-sectional view schematically illustrating yet another example of the attachment structure.

FIG. 18 illustrates an example in which the slope surface 82b is formed with a curved shape instead of a flat shape. That is, the slope surface 82b is formed along, for example, an outer peripheral surface of a cylindrical shape having its center axis extending along a tangential line of an outer rim of the rotation table.

Further, in each of the above-described examples, the fastening member 81 is moved from the upper side to the lower side for air-tightly contacting the nozzle 31 with the vacuum chamber 1. However, the above-described configuration may be arranged upside-down, so that the fastening member 81 moves from the lower side to the upper side. Alternatively, the above-described configuration may be rotated 90 degrees about an axis extending in a radial direction of the rotation table 2, so that the fastening member 81 moves in left/right directions along the axis.

Figure 19:
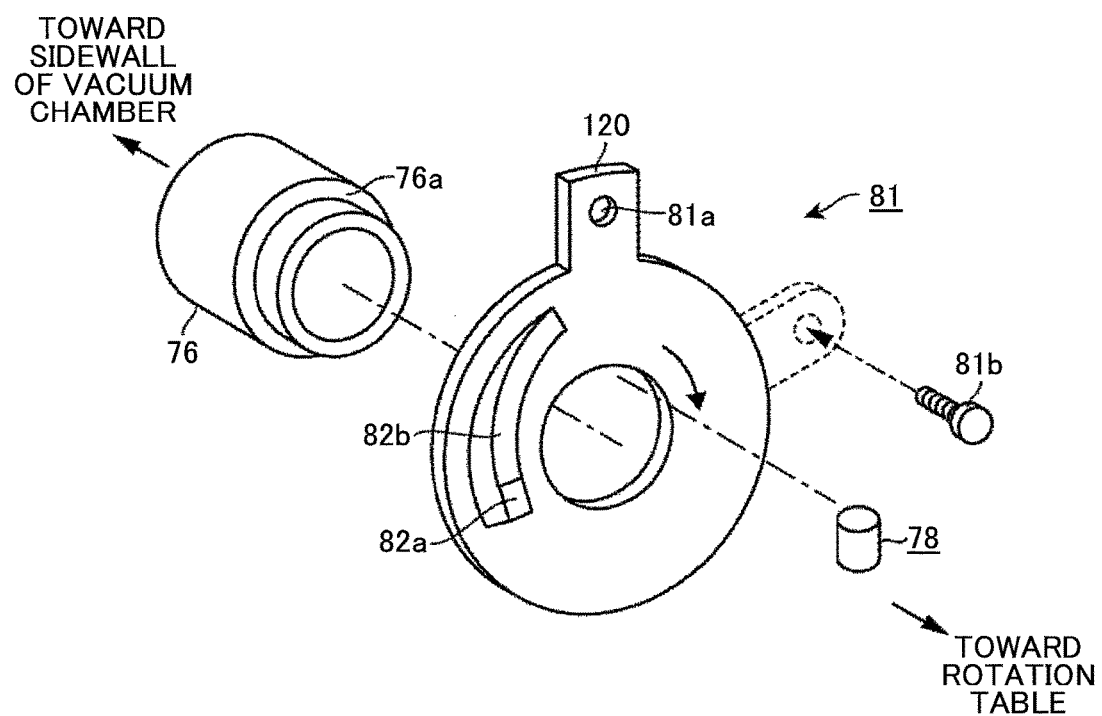
FIG. 19 is a perspective view schematically illustrating another example of the attachment structure.
Figure 20:
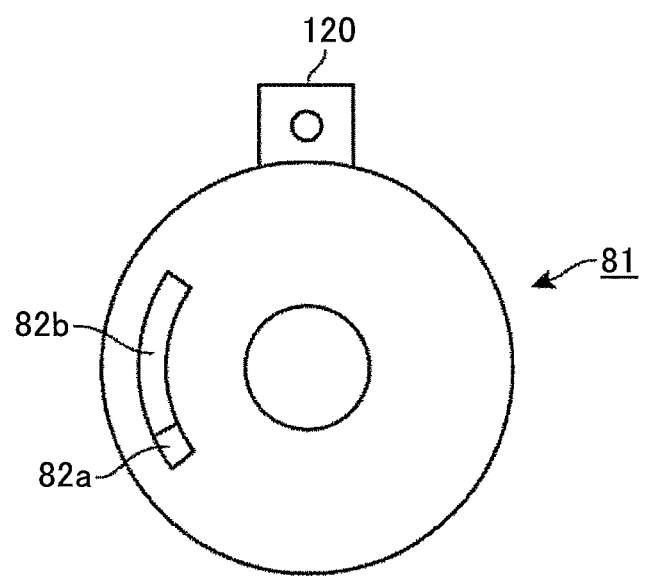
FIG. 20 is a plan view schematically illustrating another example of the attachment structure.

Further, the slope surface 82b may be formed with an arcuate shape instead of a flat shape. More specifically, as illustrated in FIGS. 19 and 20, the fastening member 81 is formed as a substantially circular plate. A surface of the fastening member 81 toward the rotation table 2 has the vertical surface 82a and the slope surface 82b along the outer edge of the fastening member 81. The vertical surface 82a is formed to be parallel with respect to an operation direction (circumferential direction) of the fastening member 81. Then, a handle part 120 is formed at the outer edge part of the fastening member 81, so that the fastening member 81 can be rotated about a horizontal axis. The handle part 120 has an opening part 81a into which the fixing member 81b is inserted. That is, first, the fastening member 81 is positioned, so that a lower end of the slope surface 82b contacts the pin 78. Then, by rotating the fastening member 81 about the horizontal axis (e.g., clockwise direction), the pin 78 is moved upward along the slope surface 82b, and the fastening member 81 is pressed toward the sealing member 75. Then, when the pin 78 reaches the vertical surface 82a, the nozzle 31 and the vacuum chamber 1 air-tightly contact each other. In FIGS. 19 and 20, like components are denoted with like reference numerals as those of the above-described embodiment and are not further explained.

In each of the above-described examples, the fastening member 81 is provided inside the vacuum chamber 1. Alternatively, the fastening member 81 may be provided outside the vacuum chamber 1 and attached to the nozzle 31 outside the vacuum chamber 1. Even in this case, the space for handling the gas supply path 73 is smaller than that of the related art example illustrated in FIG. 12.

Further, the pin 78 may be provided on one of a surface of the fastening member 81 toward the sleeve 76 or a surface of the fastening member 81 toward the rotation table 2. In this case, the slope surface 82b and the vertical surface 82a is formed on the other one of the surface of the fastening member 81 toward the sleeve 76 or the surface of the fastening member 81 toward the rotation table 2.

Hence, with the above-described embodiment of the present invention, a pressing part is provided at an inner side of a process chamber, so that the pressing part fastens a sealing member for air-tightly connecting the process chamber and an injector in a case of supplying gas inside the process chamber from an injector being air-tightly inserted into the process chamber by way of the sealing member. Accordingly, a footprint of the film deposition apparatus can be reduced because the pressing part need not be provided at an outer side of the process chamber.

Further, the present invention is not limited to these embodiments, but variations and modifications may be made without departing from the scope of the present invention.

What is claimed is:

1. A gas processing apparatus for performing a process by supplying gas to a process target, the gas processing apparatus comprising:
   an air-tight process chamber including a wall part and configured to install the process target therein;
   a through-hole that is formed in the wall part and is air-tightly in communication with a gas supply pipe provided at an outer side of the process chamber;
   an injector that is inserted to the through-hole from an inner side of the process chamber and configured to supply the gas into the process chamber from the gas supply pipe;
   a sleeve engaged to an outer peripheral surface of the injector inside the through-hole;
   an annular sealing member engaged to the outer peripheral surface of the injector and provided inside the through-hole in a position more toward the outer side of the process chamber than the sleeve;

an engagement surface that faces the sealing member and is formed in an annular shape along a wall surface of the through-hole in a position more toward the outer side of the process chamber than the sealing member; and a pressing part that is provided inside the process chamber and configured to press the sleeve toward the outer side of the process chamber;

wherein the pressing part is configured to compress the sealing member by exerting pressure to the engagement surface from an end surface of the sleeve toward the sealing member, so that an inside of the injector and an outside of the injector are air-tightly sealed.

2. The gas processing apparatus as claimed in claim 1, wherein the sleeve includes a target pressing surface formed on the inner side of the process chamber, wherein the pressing part includes a restricting part fixed in a position more toward the inner side of the process chamber than the target pressing surface, and a pressing member that is pressed in-between the target pressing surface and the restricting part, and wherein the pressing part is fixed where the pressing member is in a pressed state.

3. The gas processing apparatus as claimed in claim 2, further comprising:

a guiding part and a target guiding part that contact each other during the pressing of the pressing part, wherein the guiding part and the target guiding part are formed in at least one of an area at which the target pressing surface and the pressing member contact each other and an area at which the pressing member and the restricting member contact each other, wherein the guiding part includes a slope surface, and wherein the slope surface is configured to guide the target guiding part with respect to the guiding part and is inclined, so that the pressing member exerts pressure to the sleeve.

4. The gas processing apparatus as claimed in claim 3, wherein the guiding part includes a flat surface continuing from the slope surface and being parallel to an operating direction of the pressing part, and wherein the flat surface is configured to maintain the pressing member in a position being pressed in-between the target pressing surface and the restricting member.

5. The gas processing apparatus as claimed in claim 2, wherein the pressing member is configured to be moved in a direction intersecting an extending direction of the sleeve and pressed in-between the target pressing surface and the restricting part.

6. The gas processing apparatus as claimed in claim 2, wherein the pressing member is configured to be rotated in a circumferential direction of the sleeve and pressed in-between the target pressing surface and the restricting part.

7. The gas processing apparatus as claimed in claim 2, wherein the pressing member includes a hole part into which a screw member is inserted, and wherein the pressing member is configured to be pressed in-between the target pressing surface and the restricting part by rotating the screw member.

8. The gas processing apparatus as claimed in claim 1, wherein the through-hole is formed in a sidewall part of the process chamber.

* * * * *